United States Patent [19]
Matsubara

[11] Patent Number: 5,224,072
[45] Date of Patent: Jun. 29, 1993

[54] READ-ONLY MEMORY WITH FEW PROGRAMMING SIGNAL LINES

[75] Inventor: Hiroaki Matsubara, Tokyo, Japan

[73] Assignee: Oki Electric Industry Co., Ltd., Tokyo, Japan

[21] Appl. No.: 680,329

[22] Filed: Apr. 4, 1991

[51] Int. Cl.$^5$ .................. G11C 7/00; G11C 11/40
[52] U.S. Cl. .................. 365/189.05; 365/189.07; 365/189.12; 365/194; 365/219; 307/465
[58] Field of Search ........... 307/465; 365/168, 189.05, 365/189.07, 189.12, 194, 219, 189.08

[56] References Cited

U.S. PATENT DOCUMENTS

| | | | |
|---|---|---|---|
| 4,410,965 | 10/1983 | Moore | 365/189.05 |
| 4,506,348 | 3/1985 | Miller et al. | 365/194 |
| 4,628,480 | 12/1986 | Floyd | 365/233 |
| 4,633,441 | 12/1986 | Ishimoto | 365/219 |
| 4,811,294 | 3/1989 | Kobayashi et al. | 365/189 |
| 5,119,330 | 6/1992 | Tanagawa | 365/168 |

FOREIGN PATENT DOCUMENTS 0071154 6/1977 Japan .................. 365/189.05
2244174 11/1991 United Kingdom .......... 365/189.05

OTHER PUBLICATIONS

Stofka, Design Ideas—"Serial/parallel shifts increase RAM speed", Jan. 7, 1981, pp. 198 & 200.

Primary Examiner—William L. Sikes
Assistant Examiner—Terry D. Cunningham
Attorney, Agent, or Firm—Edward D. Manzo

[57] ABSTRACT

A signal-generating circuit receives a program signal and generates an output enable signal, a control signal, and a latch signal. In response to the output enable signal, a programmable read-only memory outputs data onto a data bus. In response to the control signal, a three-state buffer outputs data from a first register to the data bus; the data can then be stored in the programmable read-only memory by input of a chip enable signal. In response to the latch signal, a second register latches data output from the programmable read-only memory onto the data bus. An equality checker compares the contents of the first and second registers and generates an equal signal indicating whether they are equal.

9 Claims, 3 Drawing Sheets

READ-ONLY MEMORY WITH FEW PROGRAMMING SIGNAL LINES

BACKGROUND OF THE INVENTION

This invention relates to a programmable read-only memory having a programming interface circuit requiring a reduced number of input signals.

Programmable read-only memories (also referred to as PROMs), such as one-time programmable read-only memories, erasable programmable read-only memories (EPROMs), and electrically erasable programmable read-only memories (EEPROMs), are convenient for storing data and programs in electronic devices, because they can be programmed by the manufacturer of the device rather than by the manufacturer of the memory. When a PROM is embodied as an individual semiconductor device, it is programmed by writing data via external terminals connected to an internal data bus and address bus, and supplying power and control signals via other external terminals.

When a PROM is combined with another functional circuit such as a microprocessor or speech synthesizer in a single semiconductor device, however, the other functional circuit has its own external terminal requirements. If separate external terminals were used for the PROM address and data buses, the total number of external terminals would become prohibitively large, causing problems of difficult mounting and poor reliability.

The inventor has, accordingly, disclosed a scheme whereby the address bus and data bus of the PROM are not connected to external terminals. Such a PROM has an interface circuit enabling the PROM to be read by another functional circuit in the same device, and to be programmed using comparatively few external terminals. In a typical prior-art device these external terminals include a Vss (ground) terminal, a Vcc (supply voltage) terminal, a Vpp (programming voltage) terminal, and seven signal terminals: a $\overline{CE}$ (chip enable) terminal, an $\overline{OE}$ (output enable) terminal, an SCK (serial clock) terminal, an EQL (equal) terminal, a DATA (data) terminal, a DOE (data output enable) terminal, and an LS (latch signal) terminal.

It would be desirable, however, to reduce the number of external signal terminals devoted to the PROM to an even smaller number than seven, both to save space and to improve the reliability of the device of which the PROM is a part.

SUMMARY OF THE INVENTION

It is accordingly an object of the present invention to enable a PROM to be programmed using only a small number of input signals.

A programmable read-only memory circuit has a programmable read-only memory and a signal-generating circuit. The signal-generating circuit receives a program signal and activates, in sequence, a control signal, an output enable signal, and a latch signal. A first register receives and holds data to be stored in the programmable read-only memory. Responsive to the control signal, a three-state buffer outputs data held in the first register onto a data bus. The programmable read-only memory receives a chip enable signal which causes it to store data from the data bus.

Responsive to the output enable signal, the programmable read-only memory outputs stored data onto the data bus. Responsive to the latch signal, a second register receives and holds data present on the data bus. An equality checker compares the contents of the first and second registers and generates an equal signal indicating whether the two contents are equal.

DETAILED DESCRIPTION OF THE INVENTION

A novel programmable read-only memory circuit will be described with reference to the drawings, which depict a semiconductor device of which the programmable read-only memory circuit forms one part. The description will be restricted mainly to the structure and programming of the programmable read-only memory circuit, other parts of the semiconductor device being less relevant to the present invention. The drawings moreover show only one example of the invention; they do not restrict its scope, which should be determined solely from the appended claims.

Figure 1:
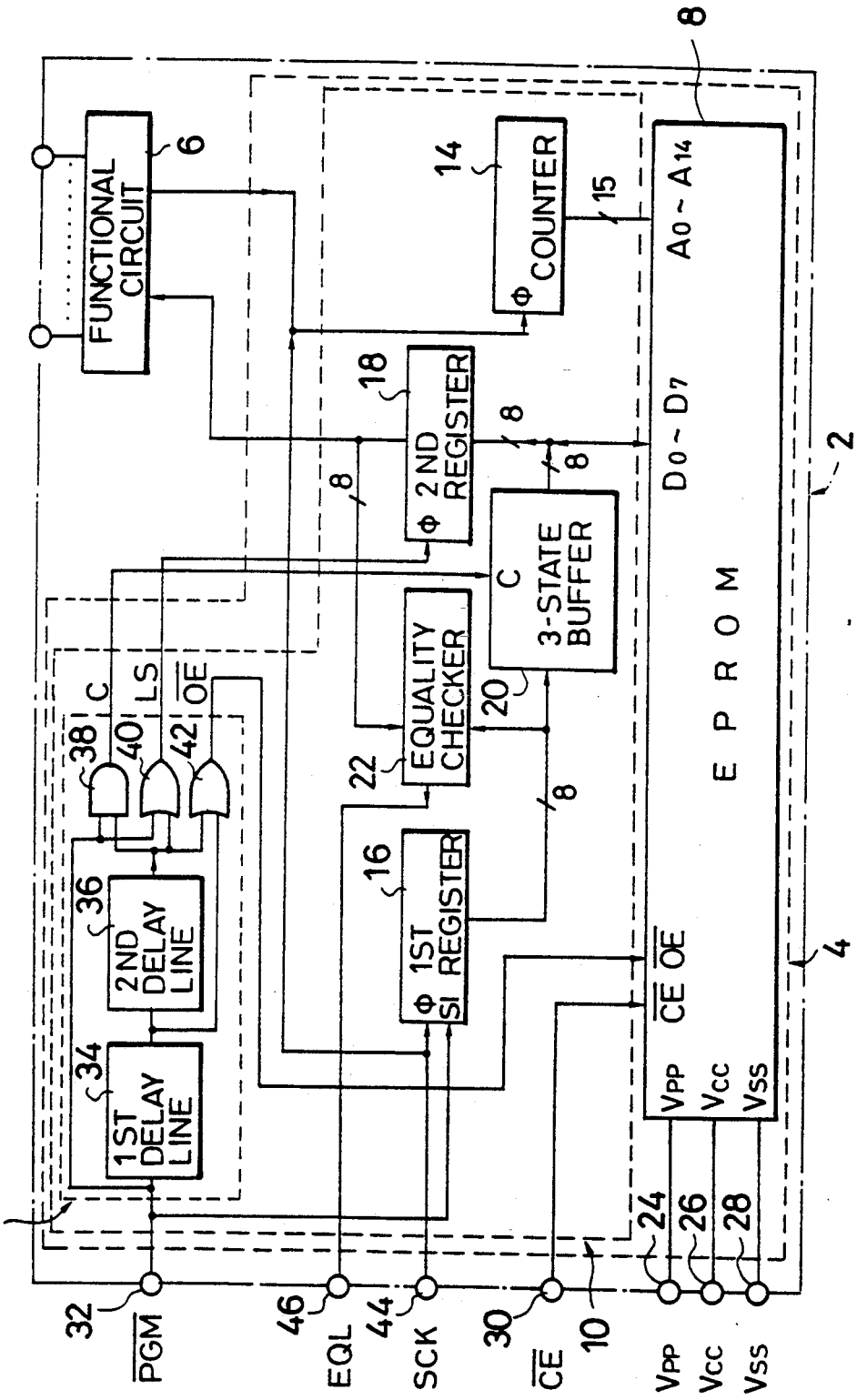
FIG. 1 is a block diagram of a novel programmable read-only memory circuit.

With reference to FIG. 1, a semiconductor device 2 comprises a programmable read-only memory circuit 4 and a functional circuit 6. The functional circuit 6 may be, for example, a microprocessor or a speech synthesizer. The invention is not restricted to use with those specific functional circuits, however; it is applicable to devices having any types of functional circuits, or to devices not having functional circuits.

The programmable read-only memory circuit 4 comprises an EPROM 8 and a interface circuit 10. The interface circuit 10, which mediates the writing of data to the EPROM 8 by an external device not shown in the drawing, comprises a signal-generating circuit 12, a counter 14, a first register 16, a second register 18, a three-state buffer 20, and an equality checker 22.

The EPROM 8 is a well-known circuit the internal structure and operation of which will not be described in detail. The EPROM 8 is connected to three external power supply terminals of the semiconductor device 2: a Vpp terminal 24 that supplies a programming voltage for programming the EPROM 8, a Vcc terminal 26 that supplies normal operating power, and a Vss terminal 28 that is connected to ground. The EPROM 8 also receives two control signals: a chip enable signal ($\overline{CE}$) received from a $\overline{CE}$ terminal 30, and an output enable signal ($\overline{OE}$) received from the signal-generating circuit 12. In addition, the EPROM 8 has an address bus comprising fifteen signal lines $A_0$ to $A_{14}$ and a data bus comprising eight signal lines $D_0$ to $D_7$. These buses are not connected to external terminals of the semiconductor device 2.

The EPROM 8 stores data present on the data bus $D_0$ to $D_7$ when the chip enable signal ($\overline{CE}$) goes low. An appropriate programming voltage must be supplied via the Vpp terminal 24 at this time. The data are stored at a location in the EPROM 8 designated by the address on the address bus $A_0$ to $A_{14}$.

The EPROM 8 outputs data onto the data bus $D_0$ to $D_7$ when the output enable signal ($\overline{OE}$) is low. The location from which the data are output is again designated by the address on the address bus. The EPROM 8 in FIG. 1 thus has a storage capacity of $2^{15} \times 8$ bits, or 256 kilobits (32 kilobytes), but the invention is of course not restricted to any particular memory capacity.

Data stored in the EPROM 8 in FIG. 1 can be erased by exposure to ultraviolet light, permitting the semiconductor device 2 to be reprogrammed as necessary, but this too is not a restriction. The invention is applicable to any type of programmable read-only memory, whether erasable, electrically erasable, or non-erasable.

The signal-generating circuit 12 receives a program signal ($\overline{PGM}$) from a $\overline{PGM}$ terminal 32, which is an external terminal of the semiconductor device 2. From the program signal the signal-generating circuit 12 generates the output enable signal ($\overline{OE}$) received by the EPROM 8, a latch signal (LS), and a control signal (C).

The signal-generating circuit 12 comprises a first delay line 34 which receives the program signal from the $\overline{PGM}$ terminal 32 and delays it by a certain amount, a second delay line 36 which receives the output of the first delay line 34 and delays it by a certain amount, and three two-input logic gates each having one input connected to the output of the second delay line 36: an AND gate 38, a first OR gate 40, and a second OR gate 42. The other input terminals of the AND gate 38 and the first OR gate 40 are connected to the $\overline{PGM}$ terminal 32. The other input terminal of the second OR gate 42 is connected to the output of the first delay line 34. The output of the AND gate 38 is the control signal (C). The output of the first OR gate 40 is the latch signal (LS). The output of the second OR gate 42 is the output enable signal ($\overline{OE}$).

The counter 14 is a fifteen-bit counter having a clock input terminal ($\phi$) connected to an SCK terminal 44 at which a serial clock signal, also referred to simply as a clock, is received. The counter 14 is adapted to count up by one for every eight clocks, starting from zero and incrementing on the $(8n+1)$-th received clock pulses ($n=1, 2, 3, \ldots$). The fifteen-bit count value of the counter 14 is output from the counter 14 to the address bus $A_0$ to $A_{14}$ of the EPROM 8.

The clock input terminal $\phi$ of the counter 14 is also connected to the functional circuit 6 to enable the functional circuit 6 to read data from desired addresses in the EPROM 8. Details of this operation will be omitted since they are not relevant to the invention.

The first register 16 is an eight-bit serial-input parallel-output shift register having a clock input terminal $\phi$ connected to the SCK terminal 44 and a serial input terminal SI connected to the $\overline{PGM}$ terminal 32. Each time a clock is received, the contents of the first register 16 are shifted one bit forward, the input at the SI terminal being shifted into the least significant bit position. The contents of the first register 16 are output at all times to the three-state buffer 20 and the equality checker 22.

The second register 18 is an eight-bit parallel-input parallel-output register, the eight-bit input of which is connected to the data bus $D_0$ to $D_7$ to receive output from the EPROM 8. The second register 18 also has a clock input terminal $\phi$, which is connected to the first OR gate 40 to receive the latch signal (LS). Each time the latch signal (LS) changes from low to high, the second register 18 latches the eight-bit input data. The contents of the second register 18 are provided at all times as eight-bit output to the functional circuit 6 and the equality checker 22.

The three-state buffer 20 has eight-bit input and output, and is also connected to the AND gate 38 to receive the control signal (C). The input of the three-state buffer 20 is received from the first register 16 as noted earlier; output of the three-state buffer 20 is connected to the data bus $D_0$ to $D_7$. When the control signal (C) is high, the three-state buffer 20 passes its eight-bit input data straight through without alteration to the data bus $D_0$ to $D_7$ (hence also to the second register 18). When the control signal (C) is low, the eight-bit output of the three-state buffer 20 is in the high-impedance state and does not affect the data bus or the second register 18.

The equality checker 22 receives the eight-bit output from the first register 16 and the eight-bit output from the second register 18, compares these two outputs, and generates an EQL signal that is high when the two outputs are the same and low when they are different. The EQL signal is sent to an EQL terminal 46 of the semiconductor device 2.

Next a more detailed description of the structure of the first delay line 34 and the second delay line 36 and of the operation of the signal-generating circuit 12 will be given.

Figure 2:
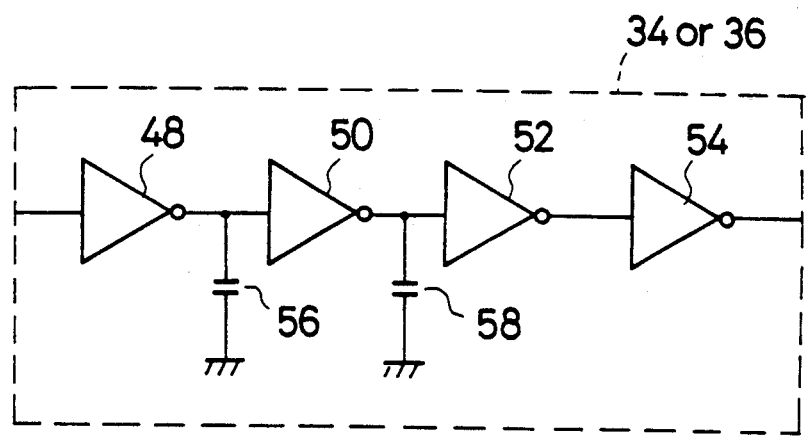
FIG. 2 is a schematic diagram of the delay lines in FIG. 1.

The first delay line 34 and the second delay line 36 both have the circuit configuration shown in FIG. 2, comprising four inverters 48, 50, 52, and 54 connected in series, a capacitor 56 connected between ground and a point between the first and second inverters 48 and 50, and a capacitor 58 connected between ground and a point between the second and third inverters 50 and 52. "Ground" refers to the Vss terminal 28 in FIG. 1, for example, or some other structure a ground potential.

The amount by which the program signal is delayed in the first delay line 34 and the second delay line 36 will be referred to hereinafter as a delay interval. The operation of the signal-generating circuit 12 when the program signal changes at a rate slower than two delay intervals will be described next.

Referring again to FIG. 1, it can readily be seen that when the program signal ($\overline{PGM}$) goes high, the latch signal (LS) output by the first OR gate 40 immediately goes high. One delay interval later the output of the first delay line 34 goes high, causing the output enable signal ($\overline{OE}$) output by the second OR gate 42 to go high. After one more delay interval the second delay line 36 goes high, at which time both inputs to the AND gate 38 are high, so the control signal (C) output by the AND gate 38 goes high.

When the program signal ($\overline{PGM}$) goes low, the control signal (C) output by the AND gate 38 immediately goes low. Two delay intervals later all inputs to the first OR gate 40 and the second OR gate 42 are low, so the latch signal (LS) and the output enable signal ($\overline{OE}$) also go low.

Next the operation by which an external device programs the EPROM 8 will be described. The external device supplies appropriate voltages to the Vpp terminal 24, the Vcc terminal 26, and the Vss terminal 28. It also sends program, serial clock, and chip enable signals via $\overline{CE}$, $\overline{PGM}$, and SCK signal lines (not explicitly indicated in the drawings) to the $\overline{CE}$ terminal 30, $\overline{PGM}$ terminal 32, and SCK terminal 44 of the semiconductor device 2, and reads the equal signal from the EQL terminal 46.

Figure 3:
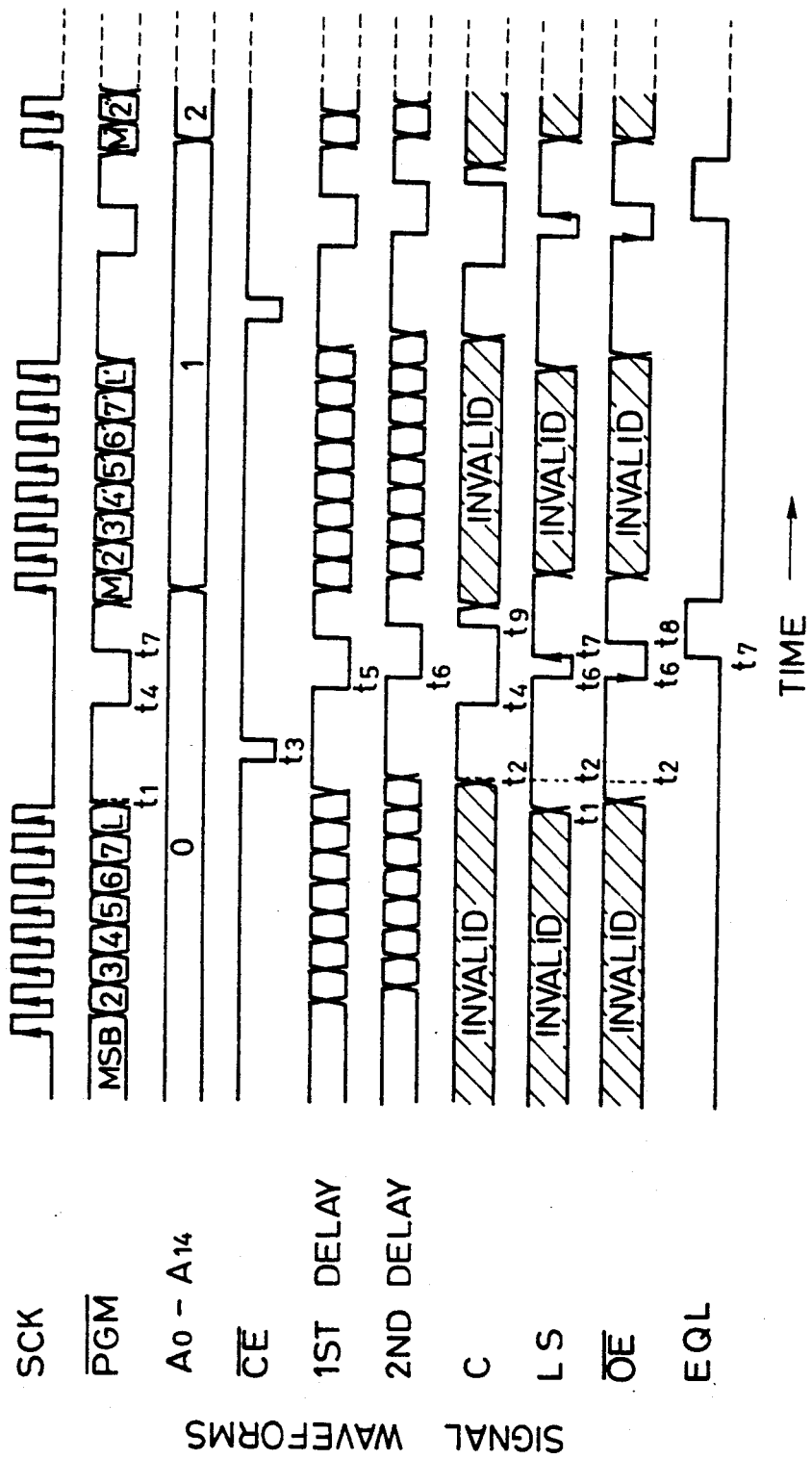
FIG. 3 is a timing diagram illustrating the programming of the read-only memory circuit in FIG. 1.

The external device begins by resetting the counter 14 to an initial value of zero, by means of a signal line not shown in the drawings. With reference to FIG. 3., the external device then repeatedly performs the following sequence of operations:

(1) Generate eight serial clock (SCK) pulses and send eight bits of data on the $\overline{PGM}$ signal line in synchronization with these pulses.
(2) Drive the $\overline{PGM}$ signal high (at time $t_1$ in FIG. 3).
(3) Wait at least two delay intervals, then generate a low chip enable ($\overline{CE}$) pulse (at time $t_3$).
(4) Drive the $\overline{PGM}$ signal low (at time $t_4$).
(5) Wait more than two delay intervals, then drive the $\overline{PGM}$ signal high (at time $t_7$).
(6) Read the EQL signal and verify that it is high.

Referring to the top two lines in FIG. 3, the external device synchronizes the eight data bits on the $\overline{PGM}$ signal line with the falling edge of the serial clock signal (SCK), sending the most significant data bit (MSB) first. At each rising edge of the serial clock signal (SCK) the current data bit on the $\overline{PGM}$ signal line is shifted into the first register 16.

As these eight data bits are input from the $\overline{PGM}$ signal line, the outputs of the AND gate 38, the first OR gate 40, and the second OR gate 42 undergo corresponding changes, generating various high and low control signals (C), latch signals (LS), and output enable signals ($\overline{OE}$). During this interval, however, the chip enable signal ($\overline{CE}$) is held high so that no data are written to the EPROM 8, and no use is made of any data read from the EPROM 8. The control (C), latch (LS) and output enable ($\overline{OE}$) signals are thus irrelevant during this interval; as such, they are marked INVALID in FIG. 3. All that matters during this interval is that the data bits input at the $\overline{PGM}$ terminal 32 be synchronized with the serial clock (SCK) so that they will be correctly stored in the first register 16.

When all eight data bits have been stored in the first register 16, at time $t_1$ the external device drives the program signal ($\overline{PGM}$) high. As explained earlier, the latch signal (LS) immediately goes high, one delay interval later the output enable ($\overline{OE}$) signal goes high, and one delay interval after that the control signal (C) goes high. Thus after two delay intervals, at time $t_2$ all three outputs of the signal-generating circuit 12 (C, LS, and $\overline{OE}$) are high. In this state the three-state buffer 20 outputs the contents of the first register 16 to the data bus $D_0$ to $D_7$ of the EPROM 8 and no data is output from the EPROM 8, while the counter 14 continues to output the value zero to the address bus $A_0$ to $A_{14}$. The EPROM 8 is now ready to be programmed at address zero.

In this state, at time $t_3$ the external device sends a low chip enable ($\overline{CE}$) pulse. This causes the EPROM 8 to store the data on the data bus $D_0$ to $D_7$, namely the data held in the first register 16, at address zero.

Next, the external device verifies that the data were written correctly. At a time $t_4$ after the low chip enable ($\overline{CE}$) pulse, the external device drives the program signal ($\overline{PGM}$) low. After one delay interval, at time $t_5$ the output of the first delay line 34 goes low, and after another delay interval, at time $t_6$ the output of the second delay line 36 goes low. The control signal (C) goes low at the time $t_4$ when the $\overline{PGM}$ signal goes low. The latch signal (LS) and output enable signal $\overline{OE}$ output go low at the time $t_6$ when the output of the second delay line 36 goes low.

At time $t_4$, the low control signal (C) places the outputs of the three-state buffer 20 in the high-impedance state. Then at time $t_6$ the low output enable ($\overline{OE}$) input to the EPROM 8 causes the EPROM 8 to begin output of the data at the current address (address zero in this case). The clock input to the second register 18 also goes low at this time.

Next, at a time $t_7$ after $t_6$, the external device drives the $\overline{PGM}$ signal high again. The latch signal (LS) immediately goes high, causing the second register 18 to latch the data output by the EPROM 8. The first register 16 now holds the data that were written to the EPROM 8 and the second register 18 holds the data read from the EPROM 8 at the same address. If the data were written correctly, the contents of these two registers will be the same, so the equality checker 22 will generate a high equal (EQL) signal as shown in FIG. 3. By reading the signal at the EQL terminal after time $t_7$ and checking that it is high, the external device can verify that correct data were written.

If the data were not written correctly, the data in the first register 16 will not match the data in the second register 18, so the EQL signal will not go high. If the equal signal (EQL) is low when read by the external device, the external device can take appropriate action such as notifying the operator of a write error.

One delay interval after the second register 18 latches the output data from the EPROM 8, at time $t_8$ the output enable ($\overline{OE}$) signal goes high and the EPROM 8 ceases data output. One delay interval after that, at time $t_9$, the output of the second delay line 36 goes high, driving the control signal (C) high, so the three-state buffer 20 resumes output of the contents of the first register 16.

After verifying the correctness of the written data, the external device repeats the entire cycle of operations. At the next serial clock (SCK) input the counter 14 increments by one to place the next address on the address bus $A_0$ to $A_{14}$. Eight new bits are now clocked into the first register 16, written to the EPROM 8 at the next address, then read and verified. Repetition of this operation may continue until data have been written to all addresses of the EPROM 8.

Since the external device has only three signal terminals (SCK, $\overline{PGM}$, and $\overline{CE}$) to control and one signal terminal (EQL) to read, the risk of faulty electrical contact is reduced as compared with the prior art, and the read-only memory can be programmed with high reliability. Moreover, after the read-only memory is programmed, the semiconductor device can be mounted and used without having to make provisions for a large number of no-longer-needed signal lines.

The circuits shown in the drawings can be modified in various ways that will be obvious to one skilled in the art without departing from the spirit and scope of the present invention. In particular, the configurations of the signal-generating circuit 12 shown in FIG. 1 and the delay line shown in FIG. 2 may be altered in various ways, as long as the sequence in which the control signal (C), the output enable signal ($\overline{OE}$), and the latch signal (LS) become active and inactive is not altered. Moreover, although the first register in FIG. 1 was described as a serial-input, parallel output shift register, it is also possible for this register to be a parallel-input, parallel-output register. In that case data to be programmed into the read-only memory can be input via an external data bus, possibly a bus shared with another functional circuit, instead of via the $\overline{PGM}$ terminal, and the $\overline{PGM}$ terminal can be connected to the counter to generate addresses, thus eliminating the need for an SCK terminal.

What is claimed is:

1. A programmable read-only memory circuit comprising:
   a signal-generating circuit for receiving a program signal and providing, in sequence, a control signal, an output enable signal, and a latch signal;
   a programmable read-only memory connected to said signal-generating circuit, having an address bus for input of an address and a data bus for input and output of data, for receiving a chip enable signal, storing data present on said data bus at said address responsive to said chip enable signal, and outputting data stored at said address onto said data bus when said output enable signal is active;
   a counter connected to said address bus, for generating said address;
   a first register for receiving and holding data to be stored to said programmable read-only memory;
   a second register, connected to said data bus and said signal-generating circuit, for receiving and holding data present on said data bus when said latch signal becomes active;
   a three-state buffer, connected to said first register, said data bus, and said signal-generating circuit, for outputting data held in said first register to said data bus when said control signal is active; and
   an equality checker, connected to said first register and said second register, for comparing contents of said first register and said second register and generating an equal signal indicating whether said contents are equal.

2. The circuit of claim 1, wherein said signal-generating circuit deactivates said control signal before activating said output enable signal.

3. The circuit of claim 1, wherein said circuit is fabricated as part of a semiconductor device and said program input signal, said chip enable signal, and said equal signal are obtained from external terminals of said semiconductor device.

4. The circuit of claim 1, wherein said first register is a serial-input, parallel-output shift register for receiving said program signal and a serial clock signal, and storing successive bits of said program signal responsive to said serial clock signal.

5. The circuit of claim 4, wherein said circuit is fabricated as part of a semiconductor device and said serial clock signal is obtained from an external terminal of said semiconductor device.

6. The circuit of claim 1, wherein said program signal, said control signal, said latch signal, and said output enable signal have a first state and a second state, and:
   said control signal is active in said first state;
   said output enable signal is active in said second state;
   said latch signal is active at transitions from said second state to said first state;
   when said program signal goes to said first state, said latch signal immediately goes to said first state, said output enable signal goes to said first state after a certain delay, and said control signal goes to said first state after a certain further delay;
   when said program signal goes to said second state, said control signal immediately goes to said second state, after which said latch signal and said output enable signal go to said second state.

7. The circuit of claim 6, wherein said signal-generating circuit comprises:
   a first delay line for receiving said program signal and delaying same by a certain amount;
   a second delay line for receiving output of said first delay line and delaying same by a certain amount;
   an AND gate for receiving said program signal and output of said second delay line and performing a logical AND operation thereon, thus generating said control signal;
   a first OR gate for receiving said program signal and output of said second delay line and performing a logical OR operation thereon, thus generating said latch signal; and
   a second OR gate for receiving output of said first delay line and output of said second delay line and performing a logical OR operation thereon, thus generating said output enable signal.

8. The circuit of claim 7, wherein said first delay line and said second delay line comprise, respectively, a first inverter, a second inverter, a third inverter, and a fourth inverter connected in series, input being received at said first inverter and output provided from said fourth inverter.

9. The circuit of claim 8, wherein said first delay line and said second delay line also comprise, respectively:
   a first capacitor connected between ground and a point between said first inverter and said second inverter;
   a second capacitor connected between ground and a point between said second inverter and said third inverter.

* * * * *